United States Patent [19]

Book

[11] Patent Number: 4,901,182

[45] Date of Patent: Feb. 13, 1990

[54] ELECTRICAL TRANSFORMER COMPONENT MOUNTING ASSEMBLY

[75] Inventor: William J. Book, Jefferson City, Mo.

[73] Assignee: Westinghouse Electric Corp., Pittsburgh, Pa.

[21] Appl. No.: 348,088

[22] Filed: May 4, 1989

Related U.S. Application Data

[63] Continuation of Ser. No. 129,220, Nov. 27, 1987, abandoned.

[51] Int. Cl.[4] .......................... H02H 7/04; H05K 7/02

[52] U.S. Cl. ...................................... 361/38; 336/105; 336/210; 361/334; 361/385

[58] Field of Search ............... 361/331, 419, 334, 380, 361/385, 400, 395, 399, 35, 36, 37, 38, 39, 40, 41; 336/105, 107, 65, 198, 208, 92, 68, 210

[56] References Cited

U.S. PATENT DOCUMENTS

| | | | |
|---|---|---|---|
| 1,309,814 | 7/1919 | Schweitzer | 366/107 X |
| 2,223,232 | 11/1940 | Smith | 361/41 |
| 2,491,338 | 12/1949 | Smith, Jr. | 361/38 |
| 2,509,935 | 5/1950 | Nelson | 361/41 |
| 3,097,346 | 7/1963 | Horelick et al. | 336/68 |
| 3,389,302 | 6/1968 | Miller | 361/41 |
| 3,479,563 | 11/1969 | Roy | 336/192 X |
| 3,516,040 | 6/1970 | Ripley et al. | 336/107 X |
| 4,112,481 | 9/1978 | Roge et al. | 361/380 X |
| 4,652,975 | 3/1987 | Scott | 361/419 X |
| 4,661,792 | 4/1987 | Watkins | 336/198 X |

FOREIGN PATENT DOCUMENTS

| | | | |
|---|---|---|---|
| 2337864 | 2/1974 | Fed. Rep. of Germany | 361/35 |
| 675894 | 11/1964 | Italy | 336/105 |
| 394425 | 6/1933 | United Kingdom | 336/107 |

*Primary Examiner*—Thomas J. Kozma
*Attorney, Agent, or Firm*—B. R. Studebaker

[57] ABSTRACT

An electrical transformer assembly characterized by a tank having opposite sides and a top access opening with a transformer structure movable into and out of the tank through the opening, the transformer structure including a coil and core assembly mounted within a support frame which frame has a top surface on which transformer components are mounted whereby the assembly of the transformer structure and transformer components are movable into or from the tank intact.

2 Claims, 1 Drawing Sheet

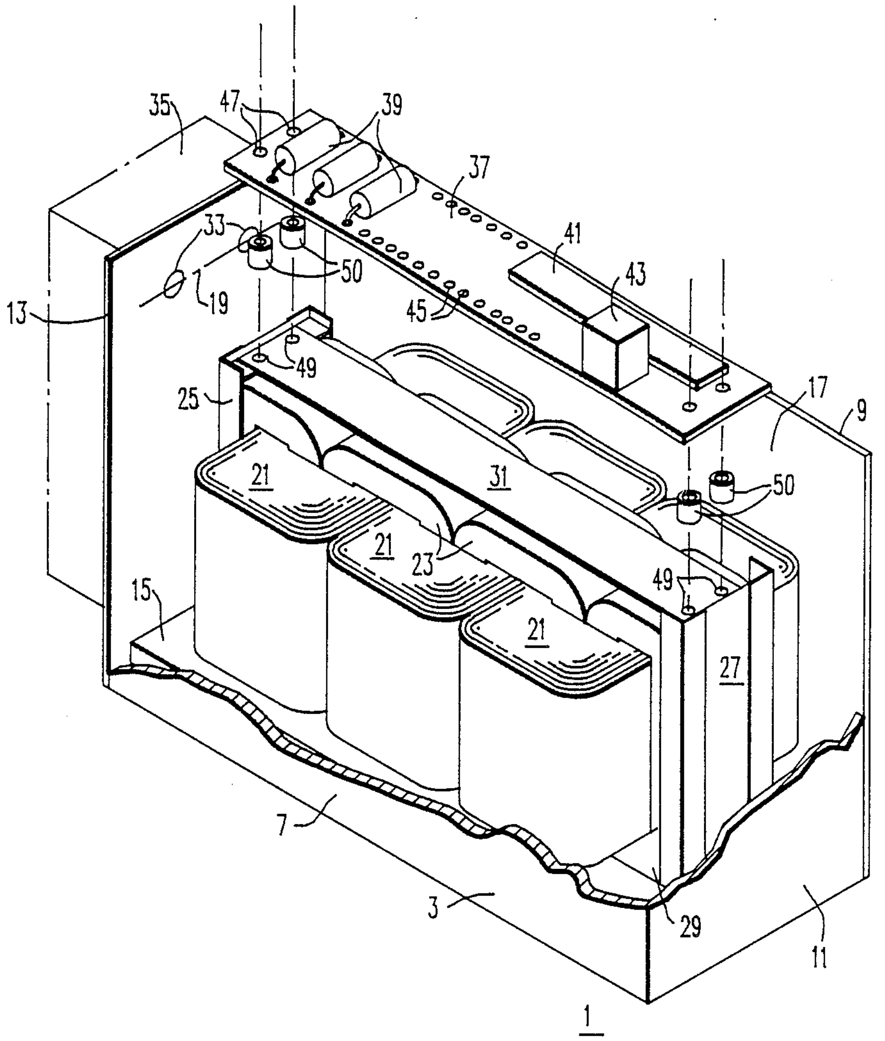
35
47
39
37
33
50
19
13
41
43
45
49
25
17
9
21
31
50
21
23
49
15
21
27
7
3
29
11
1

ELECTRICAL TRANSFORMER COMPONENT MOUNTING ASSEMBLY

This application is a continuation of application Ser. No. 129,220 filed Nov. 27, 1987 now abandoned.

BACKGROUND OF THE INVENTION

1. Field of the Invention

This invention relates in general to an electrical transformer structure and, more particularly, it pertains to a three-phase electrical transformer coil and core assembly having transformer components mounted thereon.

2. Description of the Prior Art

Electrical distribution transformer components are mounted within a tank where they are commonly cooled with an insulating or cooling dielectric fluid such as mineral oil. In the past transformer components, such as tap changers, fuses, and circuit breakers, have been mounted within the tank and normally on the inner surface of the tank wall such as shown in U.S. Pat. No. 4,504,811. A disadvantage of such mounting locations has been the necessity of mounting the component after the transformer core-coil assembly has been lowered into the tank, or dismounting the components prior to removing the transformer core-coil assembly from the tank.

SUMMARY OF THE INVENTION

In accordance with this invention, it has been found that a more satisfactory mounting assembly may be provided which comprises a tank having opposite side walls and a top access opening; a transformer structure within the tank and movable into and out of the tank through the opening; the transformer structure including a coil and core assembly which is mounted within a support frame including an insulating board on the top side of the frame; and transformer components mounted on the insulating board, whereby the assembly of the transformer structure and transformer components is movable intact through the transformer opening.

The advantages of the structure of this invention enables significant reductions in the tank height because the components are installed in an area currently not utilized and thereby enables the use of less cooling dielectric fluid. The structure also enables the assembly of the transformer components at reduced labor costs outside the tank assembly and before placement of the assembly into the tank.

BRIEF DESCRIPTION OF THE DRAWING

The single view of the drawing is a pictorial view of a transformer partially cut away and partially exploded and which is constructed according to the teachings of the invention.

DESCRIPTION OF THE PREFERRED EMBODIMENT

In the drawing a transformer construction is generally indicated at 1 and it comprises a transformer tank 3 and a transformer structure generally indicated at 5. The tank 3 is preferably of rectangular construction having opposite side walls 7, 9, opposite end walls 11, 13, a bottom wall 15, and a top access opening 17 which is normally covered with a top cover (not shown). The tank is normally filled to a level 19 with a liquid insulating and cooling medium or dielectric, such as mineral oil. The transformer structure 5 is preferably a three-phase magnetic core winding assembly including coils 21 and cores 23 associated in a conventional manner.

The magnetic core winding assembly is mounted within a frame having opposite end frame members 25, 27, a bottom frame member 29, and a top frame member 31, whereby the core-winding assembly is secured intact. The magnetic core winding assembly together with the mounting frame is immersed in the liquid dielectric which circulates within the tank and through openings 33 into and through a heat exchanger or cooler 35 which is mounted on each end wall 11, 13.

In accordance with this invention, a plurality of combinations of components for a distribution transformer are preferably mounted on a planar insulating mounting board 37. Such components may include fuses 39, a tap changer 41, and a circuit breaker 43. The insulating mounting board 37 is preferably comprised of a dielectric material, such as micarta or press board. The board 37 includes a plurality of pre-punched holes 45 to accept all known combinations of lead wires or conductors extending between the several components 39, 41, 43, and the transformer structure 5.

The mounting board 37 is attached to the top frame member 31 by means of suitable fasteners, such as screws (not shown), which extend through aligned holes 47, 49 in the board 37 and top frame member 31. Sufficient dielectric clearance is provided between the mounting board 37 and the top frame member 31 by the use of insulating spacers 50 which are held in place by the same fasteners which attach the mounting board 37 to the top frame member 41. Although the insulating mounting board 37 may be mounted and dismounted separately from the top frame member 31, it is preferably mounted in place before the transformer structure 5 is placed within the tank 3.

Because the several components 39, 41, 43 are mounted on top of the transformer structure 5 and in a space between the top frame member 31 and the access opening 17, the overall size of the transformer tank 3 may be reduced to smaller dimensions without the provision of clearance for the components which are otherwise normally mounted on one or more of the tank walls 7–13. Accordingly, the assembly of the transformer structure and insulating mounting board with the several transformer components is conveniently installed and/or removed from the tank with a minimum of effort.

In conclusion, the advantages of the transformer construction of this invention includes installation of the components in an area which is currently under utilized. The transformer construction also enables assembly of the components in place outside of the tank thus reducing labor costs. Moreover, there is a reduction of number of parts used and a facilitation of easy replacement of effective components.

What is claimed is:

1. An electrical distribution transformer assembly comprising:
   - a tank having opposite side walls, opposite end walls, a bottom wall and an access opening;
   - a transformer core winding assembly including end frame members, a bottom frame member and a top frame member, supporting and securing a plurality of coils and at least one core, said transformer core winding assembly being movable into and out of said tank through said access opening;
   - a planar insulating component mounting board including a plurality of prepunched holes there-through to accommodate a variety of component combinations thereon, mounted to and spaced from said top frame member between said core winding assembly and said access opening, a plurality of transformer components mounted to the surface of said component mounting board remote from said core winding assembly adjacent said access opening; and a plurality of insulating spacers disposed between said insulating mounting board and said top frame member whereby said transformer components are readily accessible through said access opening and are positioned such as to not impede the removal of said transformer core winding assembly from said tank.

2. The transformer assembly of claim 1 wherein said transformer components include fuses, a tap changer and a circuit breaker.

* * * * *